(12) United States Patent
Krivokapic

(10) Patent No.: US 6,380,589 B1
(45) Date of Patent: Apr. 30, 2002

(54) SEMICONDUCTOR-ON-INSULATOR (SOI) TUNNELING JUNCTION TRANSISTOR SRAM CELL

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/774,138

(22) Filed: Jan. 30, 2001

(51) Int. Cl.[7] .............................................. H01L 27/01
(52) U.S. Cl. .......................... 257/347; 257/57; 257/59; 257/72; 257/354
(58) Field of Search .............................. 257/59, 72, 57, 257/315, 316, 347, 354, 408, 412

(56) References Cited

U.S. PATENT DOCUMENTS

| | | | |
|---|---|---|---|
| 5,198,691 A | | 3/1993 | Tarng |
| 5,523,602 A | * | 6/1996 | Horiuchi et al. ............. 257/347 |
| 5,648,291 A | * | 7/1997 | Sung .......................... 438/396 |
| 5,767,530 A | * | 6/1998 | Ha .............................. 257/344 |
| 5,834,797 A | * | 11/1998 | Yamanaka ................... 257/347 |
| 5,949,706 A | * | 9/1999 | Chang et al. ................ 257/369 |
| 6,274,907 B1 | * | 8/2001 | Nakagawa .................. 257/315 |
| 6,329,672 B1 | * | 12/2001 | Lyu et al. ................... 257/347 |

OTHER PUBLICATIONS

K. Nakazato, H. Mizuta, K. Itoh, and H. Ahmed. "Silicon stacked tunnel transistor for high–speed and high–density random access memory gain cells". Electronics Letters, pp. 848–850, May 13, 1999, vol. 35, No. 10.

* cited by examiner

Primary Examiner—David Nelms
Assistant Examiner—Dao H. Nguyen
(74) Attorney, Agent, or Firm—Renner, Otto, Boisselle & Sklar, LLP

(57) ABSTRACT

A tunneling junction transistor (TJT) SRAM cell device formed on a semiconductor-on-insulator (SOI) substrate with a buried oxide (BOX) layer disposed thereon and an active layer disposed on the BOX layer having active regions defined by isolation trenches. The SOI TJT SRAM cell device includes a first gate and a second gate stacked over one of the active regions. The first gate defines a channel interposed between a source and a drain formed within one of the active regions. The second gate includes a plurality of thin nitride layer interposed between an undoped region and the first gate electrode, a side gate electrode, and a polysilicon layer. The plurality of thin nitride layers form tunneling junctions between the electrodes. The SOI TJT SRAM cell device is electrically coupled respectively to a first and a second node; and a contact plug adjacent and in electrical contact with at least one of the source and the drain.

22 Claims, 10 Drawing Sheets

SEMICONDUCTOR-ON-INSULATOR (SOI) TUNNELING JUNCTION TRANSISTOR SRAM CELL

TECHNICAL FIELD

The present invention generally relates to the manufacture of semiconductor devices, and, more specifically, relates to the manufacture of semiconductor-on-insulator (SOI) tunneling junction transistor (TJT) static random access memory (SRAM) cell devices.

BACKGROUND ART

CMOS static random access memories (SRAM) are used in the semiconductor and computer industries because of the combination of speed, low power, and no requirement for refresh. Information can be written into and read out of an SRAM cell faster than with a DRAM cell, because the transistors of the SRAM cell can be switched faster than capacitors can be charged and drained. However, one disadvantage of prior art SRAM cells is that such cells have required a larger footprint to achieve greater speed and stability than DRAM cells.

One technique attempted to overcome this disadvantage by stacking MOS transistors in a vertical arrangement. Typically, a driver transistor is formed in the substrate having source, drain, and channel regions in the substrate and a gate electrode overlaying the substrate surface. Then, a load transistor is formed in a thin-film layer overlying the first transistor. By adding an additional electrical component to the device, the thin-film transistor increases the functional capacity of a device while not consuming additional surface area, or requiring further downsizing of components.

While stacking transistors in a vertical arrangement reduces the surface area of a memory cell, valuable surface area must still be allocated for coupling electrical signals to the memory cell. Metal leads overlying the cell typically introduce the electrical signals. As the overall area dimensions of the cell decrease, the metal leads carrying electrical signals to and from the cell must be brought closer together. Constructing a memory cell with stacked transistors can aggravate this problem because elaborate contact interconnection schemes are typically required in a stacked transistor memory cell.

Additionally, such stacked cells suffer from high off-state current requirements due to the lack of isolation provided by channel side barriers (CSB). Further, typical barriers used in the source and drain regions to adjust the source impedance to the CSB fail to act as diffusion barriers, thus allowing the impurity level within the channel to increase, and requires a higher leakage current such as the gate induced drain leakage current at the drain side.

Therefore, there exists a need in the art for an SOI SRAM transistor device with increased performance, reduced layout area and better characteristics enhanced by barriers, particularly for an SOI transistor SRAM cell device.

SUMMARY OF THE INVENTION

According to one aspect of the invention, the invention is a tunneling junction transistor (TJT) SRAM cell device formed on a semiconductor-on-insulator (SOI) substrate. The SOI TJT SRAM cell device includes a first gate defining a channel (a p-type doped region) interposed between a source and a drain formed within one of the active regions defined by isolation trenches of the SOI substrate. A second gate has a thin nitride layer interposed between an undoped region and a first gate electrode, a side gate electrode, and a polysilicon layer. A contact plug is adjacent and in electrical contact with at least one of the source and the drain. The SOI TJT SRAM cell device has at least one of a plurality of electrical connections electrically coupled respectively to at least one node.

According to another aspect of the invention, the invention is a method of fabricating an SOI TJT SRAM cell device. The method includes the step of forming within an active region of an SOI substrate a source and a drain with a p-type region interposed between. The method further includes the step of forming a first gate on the active region and forming a second gate on the first gate. Additionally, the method includes the step of forming a contact plug adjacent to the stacked first and second gates and in electrical contact with the source. The contact plug electrically couples one of the active regions to a node.

According to another aspect of the invention, the invention is an SOI TJT SRAM cell device. The SOI TJT SRAM cell device includes a first gate defining a channel (a p-type doped region) interposed between a source and a drain formed within an active region defined by isolation trenches of the SOI substrate. A second gate has a thin nitride layer interposed between an undoped region and a first gate electrode, a side gate electrode, and a polysilicon layer. A first contact plug is adjacent and in electrical contact with at least one of the source and the drain. A second contact plug is adjacent and in electrical contact with the side gate electrode of the second gate. The SOI TJT SRAM cell device has at least one of a plurality of electrical connections electrically coupled respectively to at least one node.

BRIEF DESCRIPTION OF DRAWINGS

These and further features of the present invention will be apparent with reference to the following description and drawings, wherein.

DISCLOSURE OF INVENTION

Figure 1:
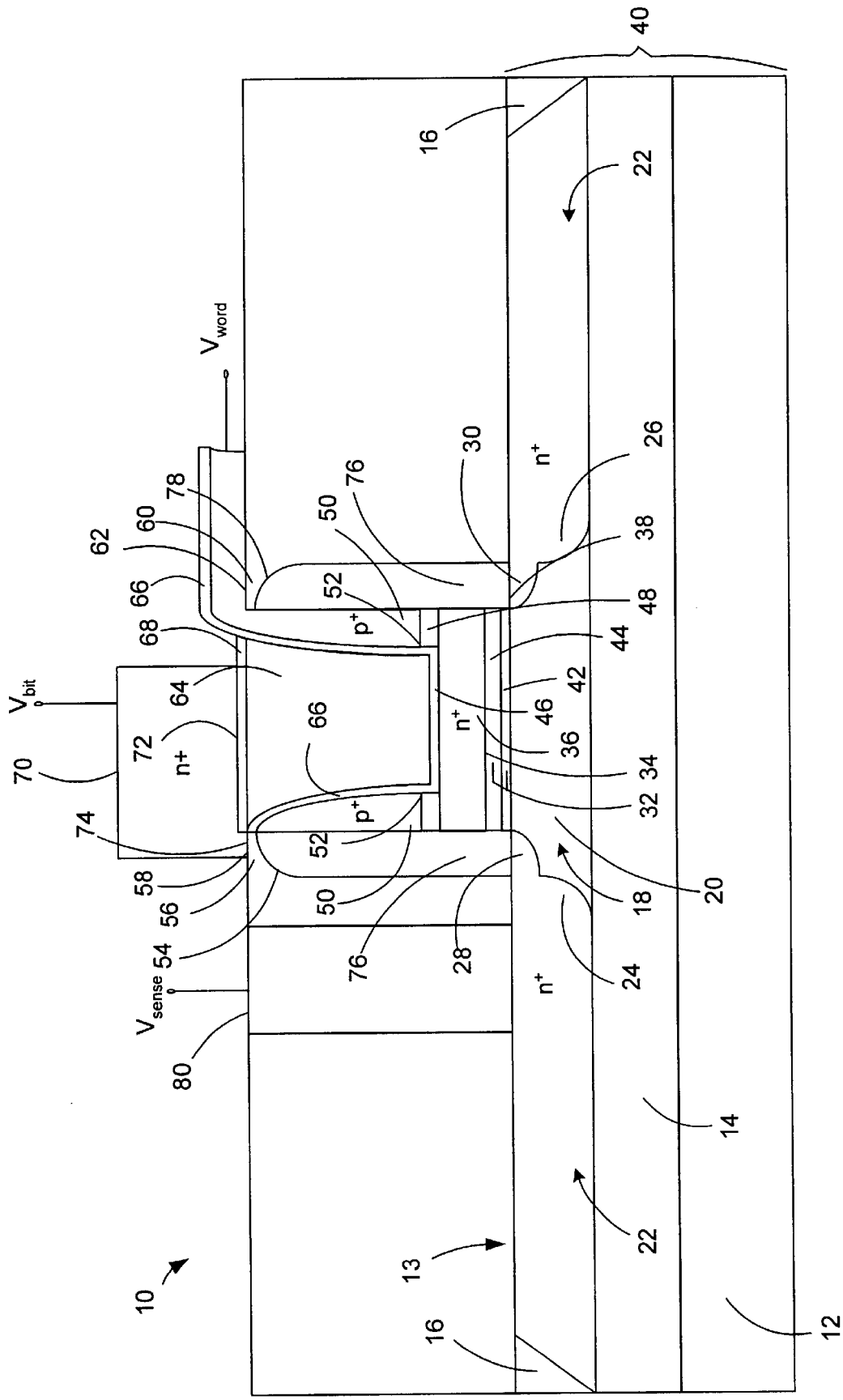
FIG. 1 is a cross-section of an SOI tunneling junction transistor (TJT) SRAM cell device according to a first embodiment of the present invention.

In the detailed description that follows, identical components have been given the same reference numerals. To illustrate the present invention in a clear and concise manner, the drawings may not necessarily be to scale and certain features may be shown in a partial schematic format.

Referring initially to FIG. 1, an SOI TJT SRAM cell device of the present invention is shown generally designated as 10. The SOI TJT SRAM cell device comprises a first gate and a second gated stacked vertically on an active region 18 of a semiconductor-on-insulator (SOI) substrate 40. The first gate defines a channel 20 or p-type doped region interposed between two identically deeply doped regions 24, 26 with lightly doped shallow extensions 28, 30 within the active region 18 on the SOI substrate 40. The second gate encloses an undoped region 64. Between the gate electrodes 36, 50, 70 and undoped region 64 are nitride tunneling junctions 46, 66, 68.

The SOI TJT SRAM cell 10 described above has a significantly faster circuit speed range than traditional SRAM cells. The stacking of the gates vertically reduces the footprint on an SOI wafer. This in turn allows more SOI TJT SRAM cell devices to be manufactured per wafer, thus reducing manufacturing costs. Additionally, the nitride barriers interposed between gates reduce the off-state voltage required as well as act as diffusion barriers during doping which in turn maintains the impurity level within the undoped region Continuing to refer to FIG. 1, a first embodiment of an SOI TJT SRAM cell device 10 will now be described in more detail. The SOI TJT SRAM cell device 10 is formed using a semiconductor-on-insulator (SOI) structure having a semiconductor substrate 12, a buried oxide (BOX) layer 14 formed on the semiconductor substrate 12 and a semiconductor layer 13 disposed on the BOX layer 14. An exemplary BOX layer may have a thickness of between 1800 and 2200 Å. Whereas, an exemplary semiconductor layer 13 disposed on the BOX layer 14 may have a thickness of between 800 and 1000 Å. Suitable semiconductor materials such as silicon, carbide or germanium may be used as the semiconductor layer 13 disposed on the BOX layer 14. Within the semiconductor layer 13 disposed on the BOX layer 14, shallow trench isolation (STI) regions 16 define the placement of a semiconductor active region 18. The STI regions 16 are insulator-filled to electrically isolate individual electrical devices such as the SOI TJT SRAM cell device 10. Other isolation techniques that are known in the art may be used to isolate the SOI TJT SRAM cell device 10.

In an exemplary embodiment, as illustrated in FIG. 1, the active region 18 has a p-type region, or channel 20, and two N+ regions, or a source and a drain 22. The channel 20 is interposed between the two N+ regions 22.

Alternatively, a n-type channel could be interposed between two P+ regions. The two N+ regions 22 have respective deep implant regions 24 and 26, as well as respective extension regions 28 and 30. The active region 18 may be predoped prior to the manufacturing of the first gate of the SOI TJT SRAM cell device 10 with p-type dopants for n-type channel devices and/or n-type dopants for p-type channel devices. Alternatively, the active region 18 may be doped during the manufacturing of the first gate in a process more fully described below. An exemplary range of concentration of these dopants is between $1 \times 10^{18}$ and $5 \times 10^{18}$ for the p-type channel 20 and between $1 \times 10^{20}$ and $2 \times 10^{20}$ atoms/cm$^3$ for the N+ regions 22.

A gate dielectric 32 is interposed between the lower surface 34 of an N+ gate electrode 36 and an upper surface 38 of a portion of the active region 18 of the SOI semiconductor substrate 40. The gate dielectric 32 illustrated in FIG. 1 is a multi-layer dielectric, however the gate dielectric could be a single layer dielectric. The gate dielectric 32 includes a thin lower dielectric layer 42 and a thin upper dielectric layer 44. The gate dielectric 32 may be made of suitable gate dielectric materials, such as silicon dioxide (SiO$_2$), silicon nitride (Si$_3$N$_4$), aluminum oxide (Al$_2$O$_3$), hafnium oxide (HfO$_2$), silicon oxynitride (SiON), or the like. In this embodiment, dielectric layer 42 is made of SiO$_2$ and dielectric layer 44 is made of Si$_3$N$_4$. An exemplary dielectric layer 42 of SiO$_2$ may have a thickness of between 5 and 6 Å. An exemplary dielectric layer 44 of Si$_3$N$_4$ may have a thickness of between 8 and 10 Å. The N+ gate electrode 36 may be made of typical, well-known gate electrode materials, for example polysilicon. An exemplary N+ gate electrode 36 may have a thickness of between 800 and 1200 Å.

On top of the N+ gate electrode 36 is a thin dielectric layer 46 interposed between an oxide layer 48. The thin dielectric layer 46 may be made of the same suitable gate dielectric materials described above. The thin dielectric layer 46 may be made of the same material as the thin dielectric layer 44 or may be made of another dielectric material described above. An exemplary thin dielectric layer 46 may have a thickness of between 30 and 50 Å. A P+ side gate electrode 50 extends upward from the upper surface 52 of the dielectric layer 46. The oxide layer 348 may be made of silicon dioxide (SiO$_2$) or any of a variety of suitable materials for use in a later step to protect portions of the gate electrode 336 from an etchant. It will be understood that the use of the term oxide with regard to the oxide layer 348 or portions thereof, encompasses the variety of suitable well-known materials for protecting the gate electrode 336. An exemplary oxide layer 348 may have a thickness of between 30 and 50 Å.

As illustrated on the left hand side of the gate region in FIG. 1, the P+ side gate electrode 50 extends substantially to the bottom portion 54 of the overhang 56 of a tetraethylorthosilicate (TEOS) layer 58. The P+ side gate electrode 50 may be made of typical, well-known gate electrode materials, for example polysilicon. The P+ side gate electrode 50 may be P+ predoped. An exemplary side gate electrode 50 may have a thickness of about 150 Å. As illustrated on the right hand side of the gate region in FIG. 1, the P+ side gate electrode 50 extends substantially over an overhang 60 of a TEOS layer 62 and covers a portion of the TEOS layer 62. Exemplary TEOS layers 58, 62 may have thicknesses between 3500 and 4500 Å.

The P+ side gate electrode 50 thereby defines an undoped region, or channel 64 between thin dielectric layers 66 which cover the side gate electrode 50. The undoped region 64 may be made of typical, well-known conductive materials, for example polysilicon. An exemplary undoped region 64 may have a thickness of about 500 Å. A thin dielectric layer 68 covers the undoped region 64. The dielectric layers 66, 68 may be made of typical, well-known dielectric materials, such as silicon dioxide (SiO$_2$), silicon nitride (Si$_3$N$_4$), aluminum oxide (Al$_2$O$_3$), hafnium oxide (HfO$_2$), silicon oxynitride (SiON), or the like.

An N+ gate electrode 70 extends upward from a portion of the upper surface 72 of the thin dielectric layer 68 and a portion of an upper surface 74 of overhang 56. The N+ gate electrode 70 may be made of typical, well-known gate electrode materials, for example polysilicon. The polysilicon may be predoped with p-type dopants for n-type channel devices and/or n-type dopants for p-type channel devices.

An exemplary range of concentration of these dopants is between $1\times10^{19}$ and $1\times10^{20}$ atoms/cm$^3$. An exemplary N+ polysilicon layer 70 may have a thickness of between 500 and 700 Å.

It will be appreciated that the active region 18, the channel region 20, the source and the drain 22, the gate dielectric 32, the N+ gate electrode 36, the side gate electrode 50, the undoped region 64, the thin dielectric layers 46, 66, 68, and the N+ gate electrode 70 together form the SOI TJT SRAM cell device of the present invention. The principles of operation of an SOI TJT SRAM cell for inducing a conduction path (tunneling junction) between source regions and drain regions of the stacked gate devices are well known. It will further be appreciated that the SOI TJT SRAM cell device 10 may alternatively have other shapes than the shape shown in FIG. 1.

Spacers 76 extend upward from the upper surface 38 of the SOI substrate 40 on either side of the gate electrode 36. The spacers 76 extend substantially to the bottom portions 54, 78 of the overhangs 56, 60, respectively. Exemplary spacers 76 may have a height of between 3000 and 4000 Å.

A contact plug 80 is formed in the TEOS layer 58 over the source region 22. As is known in the art, the contact plug 80 establishes an electrical connection to the source region 22. Instead of the contact plug shown, metal layers (not shown) could be formed in the TEOS layer 58 to establish electrical connection to the source 22. $V_{sense}$, $V_{bit}$, $V_{word}$, or other electrical connections may be established to the contact plug 80, N+ gate electrode 70 and the side gate electrode 50, respectively. The contact plug 80 can also be used along with any contacts and metal layers to establish electrical connection between other nodes (such as an I/O pad or Vss), source or drain of the device.

A variety of materials can be used for the contact plug 80, including single metal layers as well as metal alloy layers containing two or more metals. One such appropriate metal is tungsten. Tungsten has the advantageous property of high electrical conductivity. Further, tungsten has a high melting temperature, which allows it to endure high-temperature manufacturing processes such as annealing, for example, as described in detail below.

It will be appreciated that other suitable metals may alternatively or in addition be used for the contact plug 80. For example, layers of different types of metals may be used, if desired. Alternatively, alloys or other combinations of suitable metals may be employed. Alternative examples of other materials include aluminum, copper, gold, nickel, palladium, platinum, silver, tantalum, titanium, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof. The advantageous property of high electrical conductivity of a metal contact plug 80 makes for lower resistance connections between the gate electrodes 36, 50, 70 and other electrical components of the SOI TJT SRAM cell device 10. However, it will be appreciated that suitable non-metallic semiconductor materials, such as silicon, may alternatively be employed in the contact plug 80, if desired.

The contact plug 80 should have electrical conductivity in the range of 0.1 to 10 ohm/square. As will be described in detail below, the contact plug 80 can be formed before or after definition and fabrication of the other components of the SOI TJT SRAM cell device 10. Should silicon be used as the material for the contact plug 80, a thermal cycle may be added to the fabrication process to re-crystallize the silicon deposited for the contact plug 80 with the silicon of the semiconductor layer 13.

Although the illustrated SOI TJT SRAM cell device 10 is a SRAM cell on a semiconductor-on-insulator (SOI) structure, other devices on other types of SOI structures such as germanium-on-insulator, can also be improved using the TJT features of the SOI TJT SRAM cell device 10 described herein.

Figure 2:
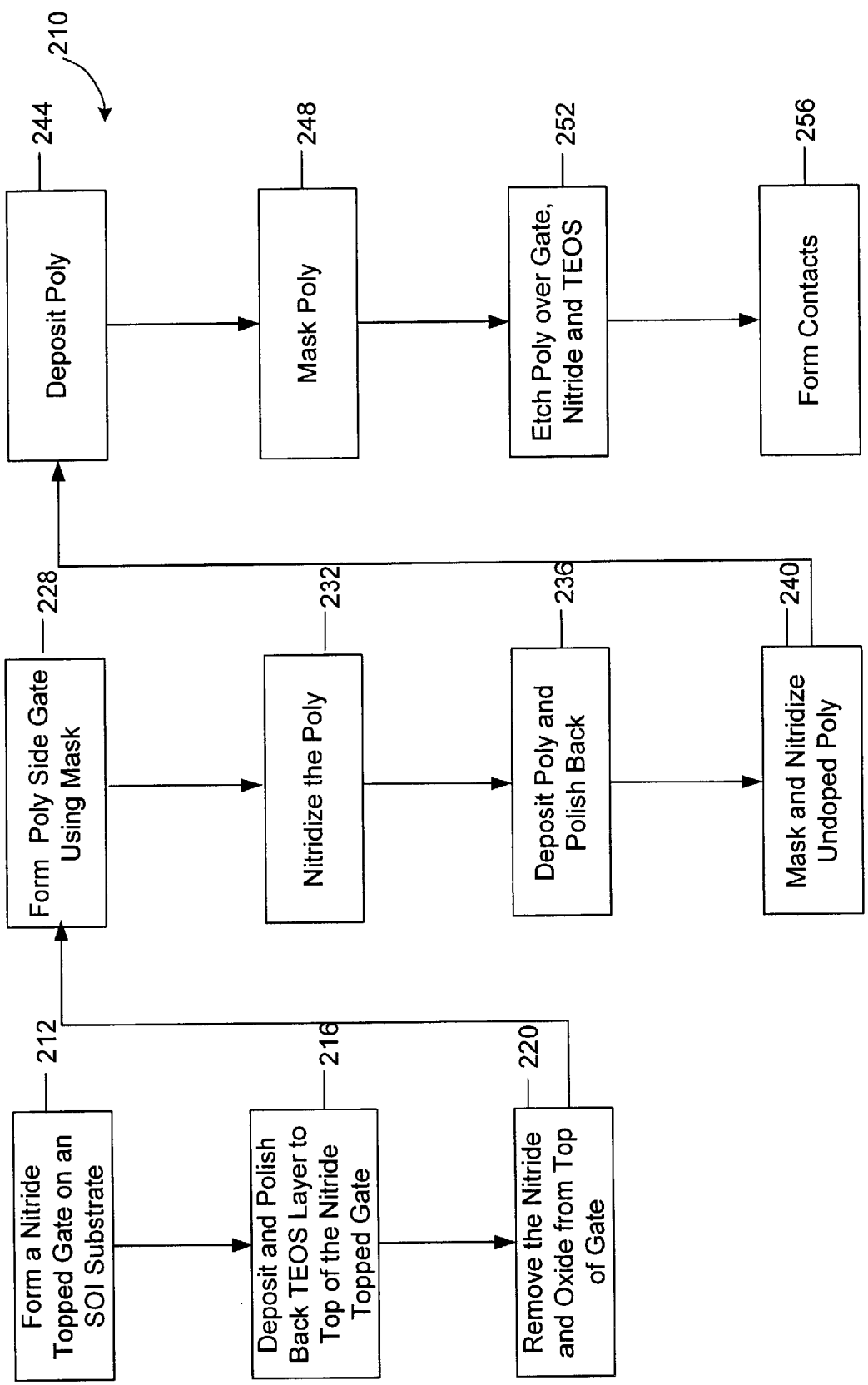
FIG. 2 is a flow diagram of a method of manufacturing the SOI TJT SRAM cell device according to the present invention.

The steps of a method 210 for fabricating a semiconductor device 310 (which may be similar to the semiconductor device 10 described above) are outlined in the flow chart shown in FIG. 2. FIGS. 3A–3G illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

Figure 3A:
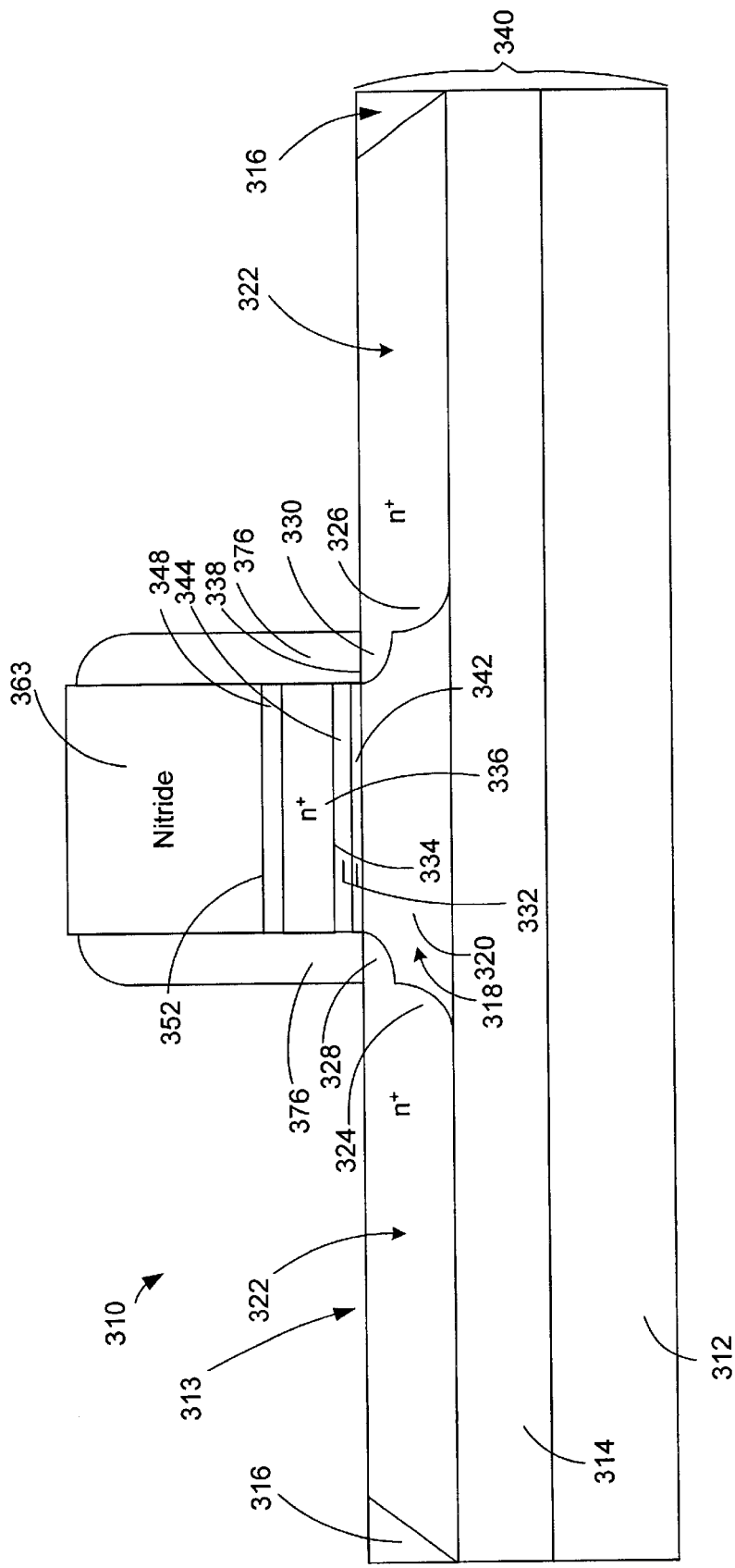
FIG. 3A is a cross-section of the SOI TJT SRAM cell device according to the present invention in a first intermediate stage of manufacture.
Figure 3B:
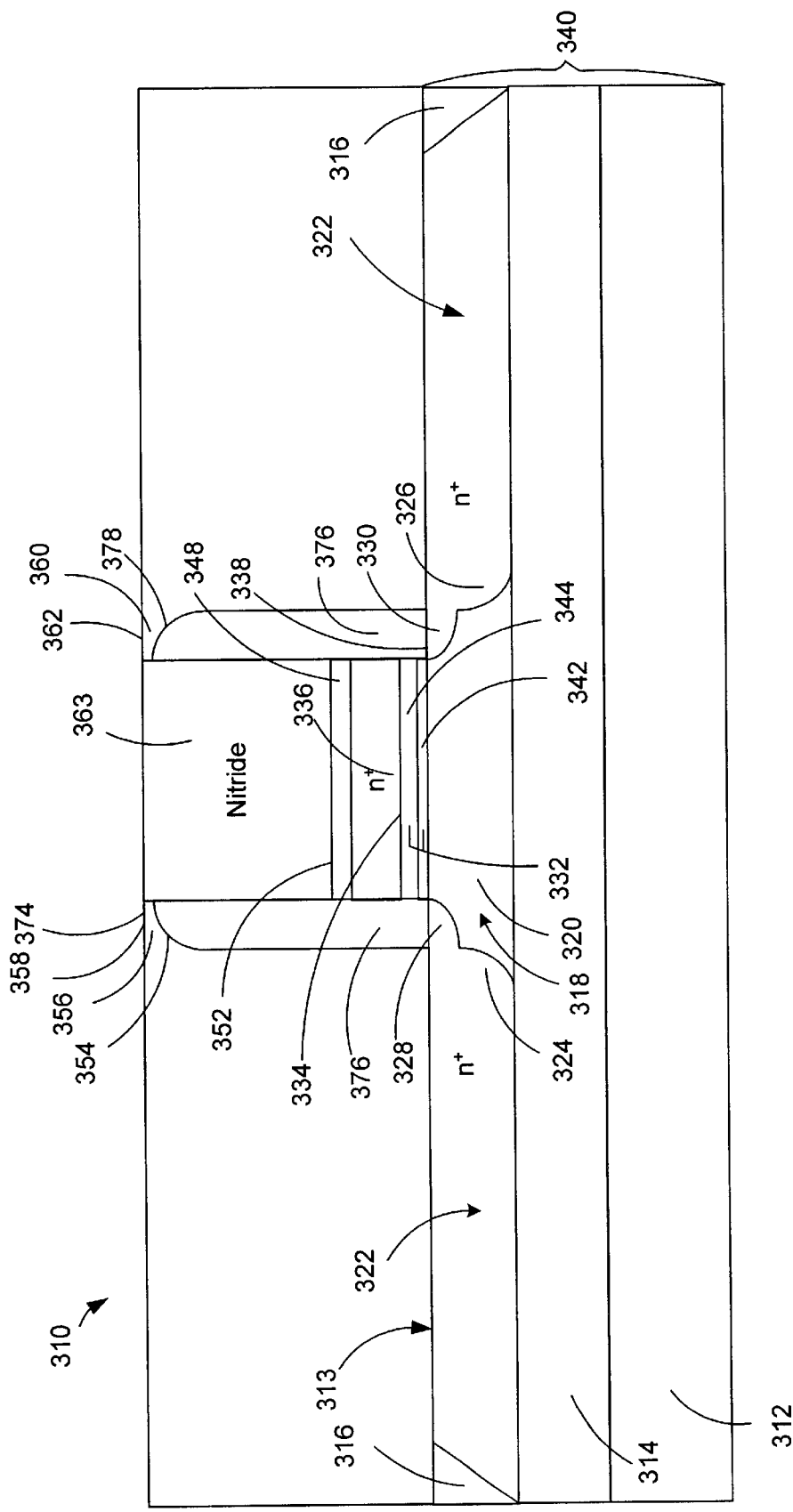
FIG. 3B is a cross-section of the SOI TJT SRAM cell device according to the present invention in a second intermediate stage of manufacture.

In step 212 of the method 210, a conventional polysilicon gate with a nitride layer 363 on top is formed on an SOI substrate 340 as an intermediate stage of manufacture for the SOI TJT SRAM cell device 310. As shown in FIG. 3A, the SOI TJT SRAM cell device 310 includes a semiconductor substrate 312, a BOX layer 314 formed on the semiconductor substrate 312 and a semiconductor layer 313 disposed on the BOX layer 314. An exemplary BOX layer may have a thickness of between 1800 and 2200 Å. Whereas, an exemplary semiconductor layer 313 disposed on the BOX layer 314 may have a thickness of between 800 and 1000 Å. Suitable semiconductor materials such as silicon, carbide or germanium may be used as the semiconductor layer 313 disposed on the BOX layer 314. Within the semiconductor layer 313 disposed on the BOX layer 314, shallow trench isolation (STI) regions 316 define the placement of a semiconductor active region 318. The STI regions 316 are insulator-filled to electrically isolate individual electrical devices such as the SOI TJT SRAM cell device 310. Other isolation techniques that are known in the art may be used to isolate the SOI TJT SRAM cell device 310.

In an exemplary embodiment, as illustrated in FIG. 3A, the active region 318 has a p-type region, or channel 320, and source and drain regions (two N+ regions) 322. The p-type region 320 is interposed between the two N+ regions 322. Alternatively, an n-type region can be interposed between two P+ regions. The two N+ regions 322 have respective deep implant regions 324 and 326, as well as respective extension regions 328 and 330. The active region 318 may be predoped prior to the manufacturing of the nitride topped gate with p-type dopants for n-type channel devices and/or n-type dopants for p-type channel devices. Alternatively, the active region 318 may be doped after the manufacturing of the nitride topped gate device in a process more fully described below. An exemplary range of concentration of these dopants is between $1\times10^{18}$ and $5\times10^{18}$ for the p-type channel 20 and between $1\times10^{20}$ and $2\times10^{20}$ atoms/cm$^3$ for the N+ regions 22.

A gate dielectric 332 is interposed between the lower surface 334 of an N+ gate electrode 336 and an upper surface 338 of the SOI semiconductor substrate 340. The gate dielectric 332 illustrated in FIG. 3A is a multi-layer dielectric, however the gate dielectric could be a single layer dielectric. The gate dielectric 332 includes a thin lower dielectric layer 342 and a thin upper dielectric layer 344. The gate dielectric 332 may be made of suitable gate dielectric materials, such as silicon dioxide (SiO$_2$), silicon nitride ($Si_3N_4$), aluminum oxide ($Al_2O_3$), hafnium oxide ($HfO_2$), silicon oxynitride (SiON), or the like. In this embodiment, dielectric layer 342 is made of $SiO_2$ and dielectric layer 344 is made of $Si_3N_4$. An exemplary dielectric layer 342 of $SiO_2$ may have a thickness of between 5 and 6 Å. An exemplary dielectric layer 344 of $Si_3N_4$ may have a thickness of between 8 and 10 Å. The N+ gate electrode 336 may be made of typical, well-known conductive materials, for example polysilicon. An exemplary N+ gate electrode 336 may have a thickness of between 800 and 1200 Å.

On top of the N+ gate electrode 336 is an oxide layer 348. The oxide layer 348 may be made of silicon dioxide ($SiO_2$) or any of a variety of suitable materials for use in a later step to protect portions of the gate electrode 336 from an etchant. It will be understood that the use of the term oxide with regard to the oxide layer 348 or portions thereof, encompasses the variety of suitable well-known materials for protecting the gate electrode 336. An exemplary oxide layer 348 may have a thickness of between 30 and 50 521.

Spacers 376 extend upward from the upper surface 338 of the SOI substrate 340 on either side of the gate electrode 336. Exemplary spacers 376 may have a height of between 3000 and 4000 Å. The spacers 376 thereby define a nitride layer 363 interposed between the spacers 376. The nitride layer 363 may be made of typical, well-known nitrides, for example silicon nitride ($Si_3N_4$), aluminum oxide ($Al_2O_3$), hafnium oxide ($HfO_2$), silicon oxynitride (SiON), or the like. An exemplary nitride layer 363 may have a thickness of about 500 Å.

It will be appreciated that known methods may be used to form the intermediate device shown in FIG. 3A. It will further be appreciated that the insulator-filled isolation trenches 316 may be formed in a later step in the method, rather than being formed as part of the intermediate device shown in FIG. 3A.

The implanting of regions of the semiconductor substrate 340, which may be performed during the nitride topped gate device formation, is described below. The implants produce source and drain regions, two N+ regions 322 in the substrate 340. A channel region 320 defined by the gate dielectric 332, between the source and the drain 322 remains p-type doped.

The source and the drain regions 322 have respective source and drain deep implant regions 324 and 326, as well as respective source and drain extensions 328 and 330. The source and drain regions may be formed by a combination of implants, such as main perpendicular implants and extension perpendicular implants.

After the nitride topped gate is formed and prior to formation of the spacers 376, an extension perpendicular implant is performed. The extension perpendicular implant is a relatively low energy, low concentration implant which is capable of producing the source and drain extensions 328 and 330. The total concentration of the extension implants may be, for example, between $1 \times 10^{19}$ atoms/$cm^3$ and $1 \times 10^{20}$ atoms/$cm^3$. The extension perpendicular implants may be of the same material as the main perpendicular implant, or may alternatively include different materials. However, it will be appreciated that the extension implants may be different from one another, if so desired.

After the perpendicular extension implants, a spacer material such as an oxide material, for example silicon dioxide ($SiO_2$), is then deposited on the substrate 340 (not shown). The deposition produces an oxide layer upon a top surface 338 of the SOI substrate 340. The oxide deposition may be performed, for example, by plasma enhanced chemical vapor deposition (PECVD).

The oxide is etched with a suitable etchant. The substrate oxide layers are reduced in size, leaving the oxide spacers 376 shown in FIG. 3A. The oxide spacers 376 may extend from a surface 338 of the semiconductor substrate 340 to a height of between 3000 and 4000 Å.

Now, the main source and drain regions may be formed by a main perpendicular implant, which will not affect the extension implant due to the spacers 376 acting as masks. The main perpendicular implant is a relatively high energy, high concentration implant which is capable of producing the source and drain deep implant regions 324 and 326. An exemplary range of implant dose for the perpendicular implant is between $1 \times 10^{15}$ and $2 \times 10^{15}$ atoms/$cm^2$.

Although the extension implantation and the main implantation are illustrated as each involving one implant, it will be appreciated that a greater number of implants may be employed. Further, halo implants may be used in forming the extension implantation after gate 36 patterning or/and spacer formation 76. For example, tilt angle extension implants (35–45 degrees) implanting In or $BF_2$ utilizing four rotations for a total implantation dose between $3.5 \times 10^{13}$ and $5 \times 10^{13}$ atoms/$cm^2$ with energies 30–80 keV.

It will be appreciated that many alternative sequences or steps may be used to accomplish the implantation. For example, the extension implants may be performed before the formation of the gate dielectric 332 upon the SOI substrate 340 by conventional, well-known methods and means.

After implantation, the semiconductor device 310 is subjected to rapid thermal annealing (RTA). Exemplary RTA may be performed for between five and fifteen seconds at a temperature of 1,020–1,050° C.

Next, in step 216, a TEOS layer is deposited on the SOI substrate 340 and on the nitride topped gate. The layer of TEOS reaches between 500 and 1000 Å above the nitride layer 363 of the nitride topped gate. Next, the TEOS is polished back to the top surface of the nitride layer of the nitride topped gate. The result of this step is TEOS layers 358, 362, which are illustrated on opposite sides of the gate device 310, respectively. TEOS layers 358, 362 have overhangs 356, 360 with lower surfaces 354, 378 which are formed through contact with the spacers 376. The polishing is done using conventional techniques, which are well-known in the art.

In step 220 of the method 210, an etch of hot phosphoric acid is performed down to the gate electrode 336. Thus all of the nitride layer 363, and a small part of the oxide layer 348 are removed, thereby leaving an upper surface of the N+ polysilicon gate electrode 336 exposed. It will be appreciated that other suitable selective etching methods well-known in the art may be used.

Figure 3C:
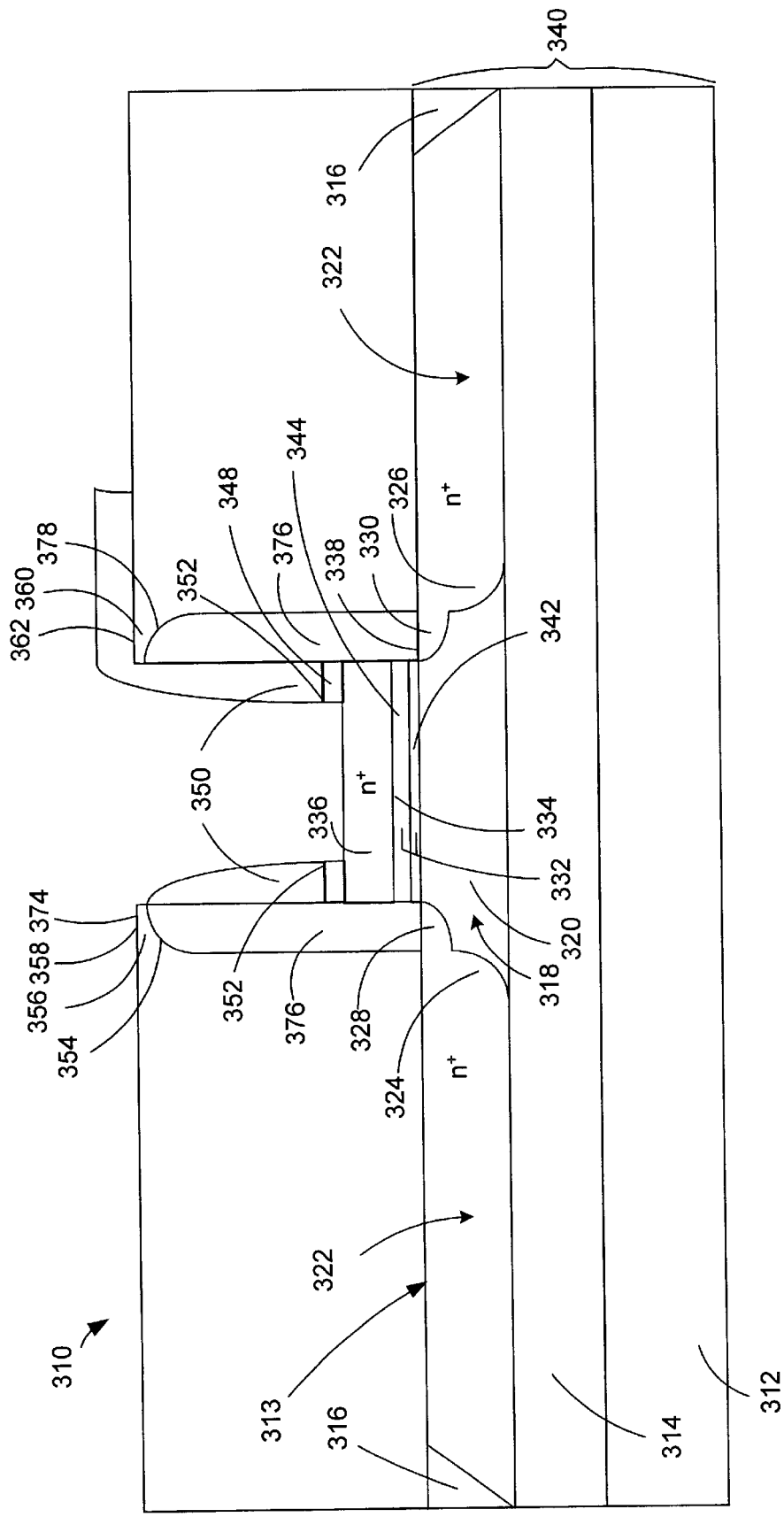
FIG. 3C is a cross-section of the SOI TJT SRAM cell device according to the present invention in a third intermediate stage of manufacture.

Next in step 228, a polysilicon side gate 350 is formed in the opening defined by the spacers 376 wherein the nitride layer 363 has been removed. The polysilicon side gate electrode 350 may be predoped with P+ dopants. After poly deposition, a mask is used to protect one side wall gate. Next, polysilicon is anisotropically etched to form a poly spacer. The resulting structure as illustrated in FIG. 3C remains.

Figure 3D:
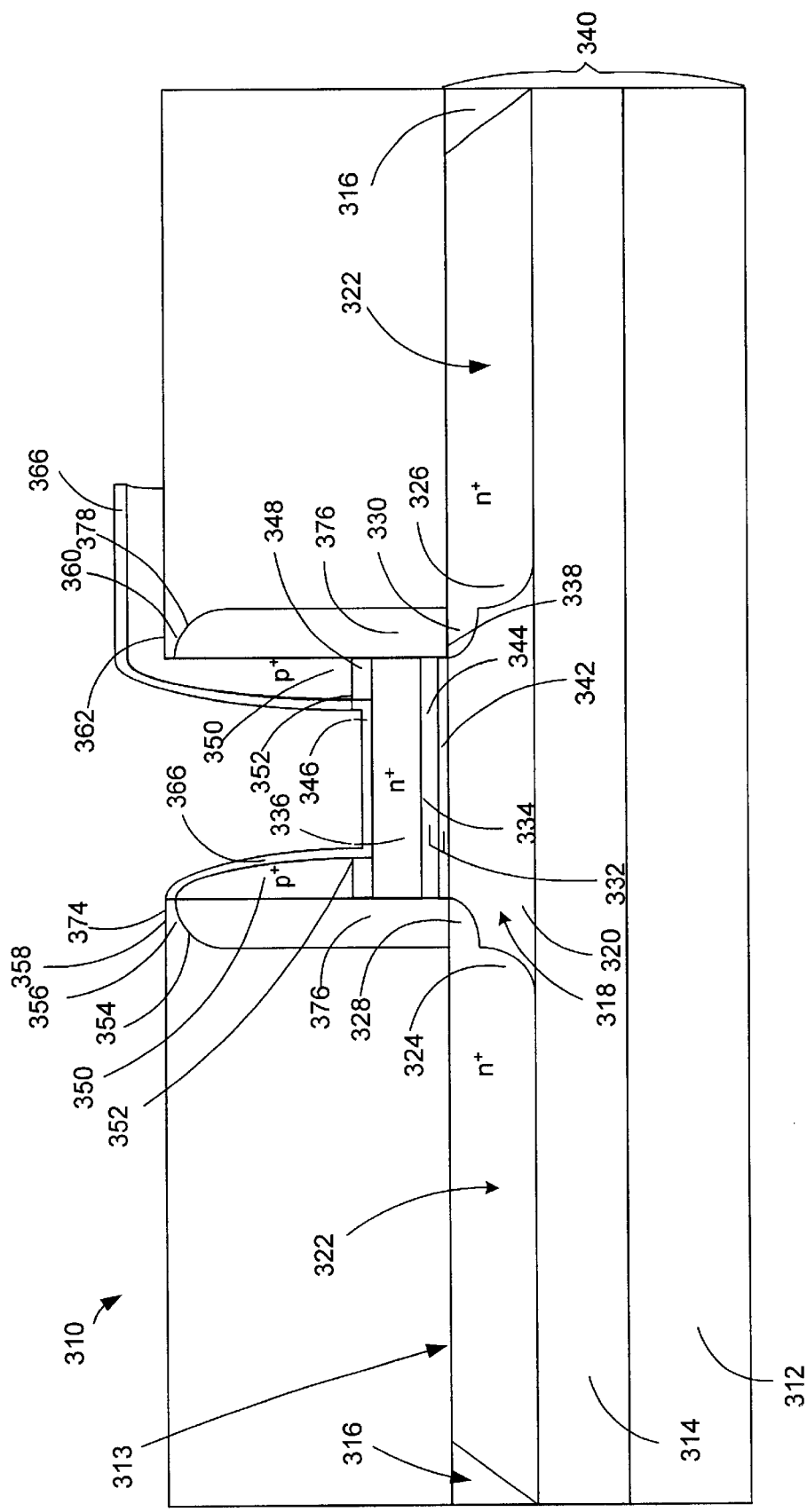
FIG. 3D is a cross-section of the SOI TJT SRAM cell device according to the present invention in a fourth intermediate stage of manufacture.

Thereafter, in step 232, the polysilicon side gate electrode 350 and the polysilicon gate electrode 336 are nitridized. The nitridation can be done for example in NH3 at 900° C. for 2 to 3 minutes. The nitridation forms thin nitride layers 366 on the side gate electrode 350, as illustrated in FIG. 3D. Depositing nitride using conventional RTA techniques may also form the thin nitride layer 366.

Figure 3E:
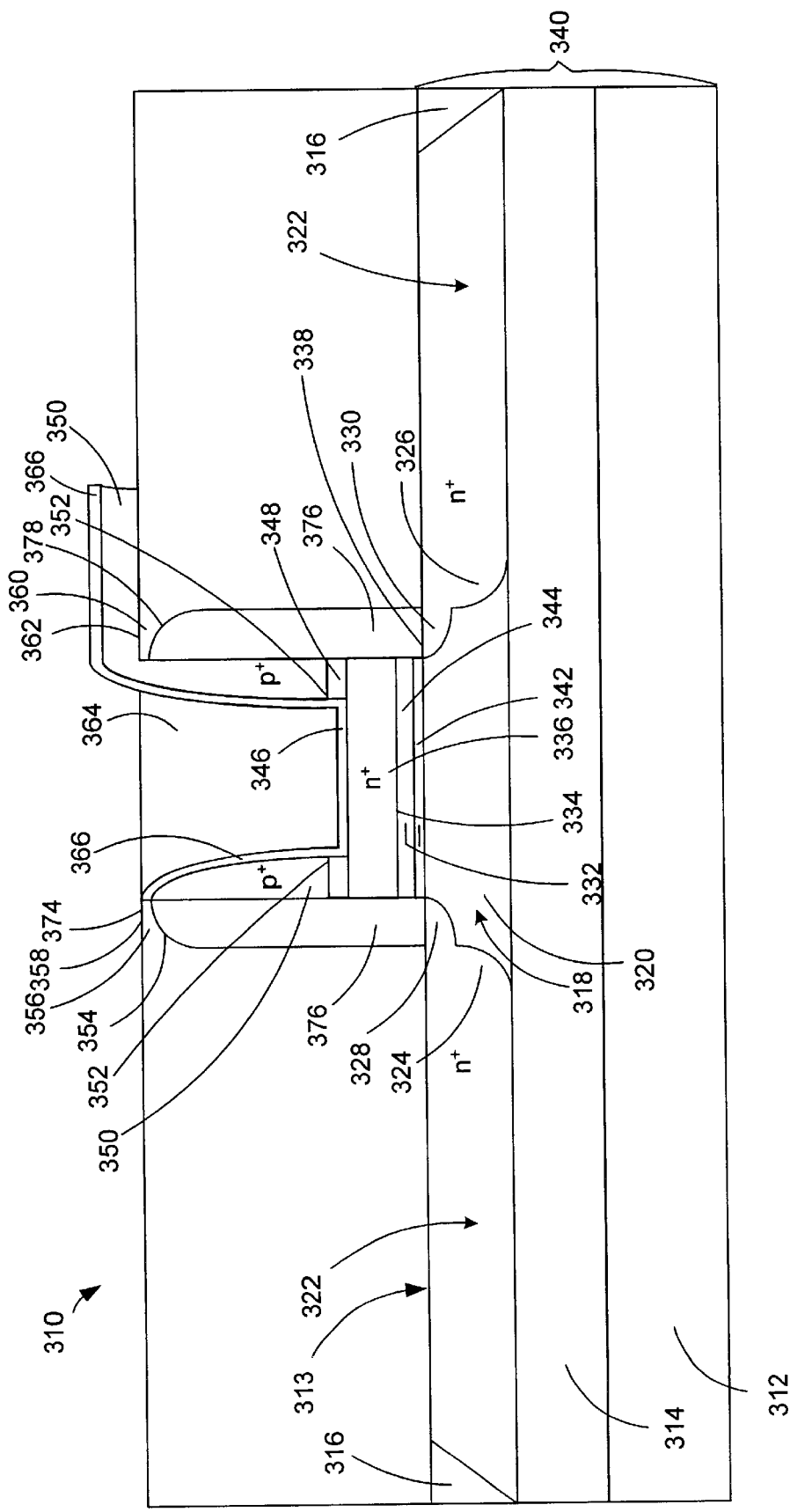
FIG. 3E is a cross-section of the SOI TJT SRAM cell device according to the present invention in a fifth intermediate stage of manufacture.

Next, in step 236, an undoped polysilicon layer is deposited in an opening defined by the thin nitride layers 346, 366. The undoped polysilicon layer is between 500 and 1000 Å above the upper surface 374 of TEOS layer 358. Next, the undoped polysilicon layer is polished back to be even with the upper surface 374 of the TEOS layer 358. The polishing is done using conventional techniques, which are well-known in the art. The resulting structure is illustrated in FIG. 3E.

Figure 3F:
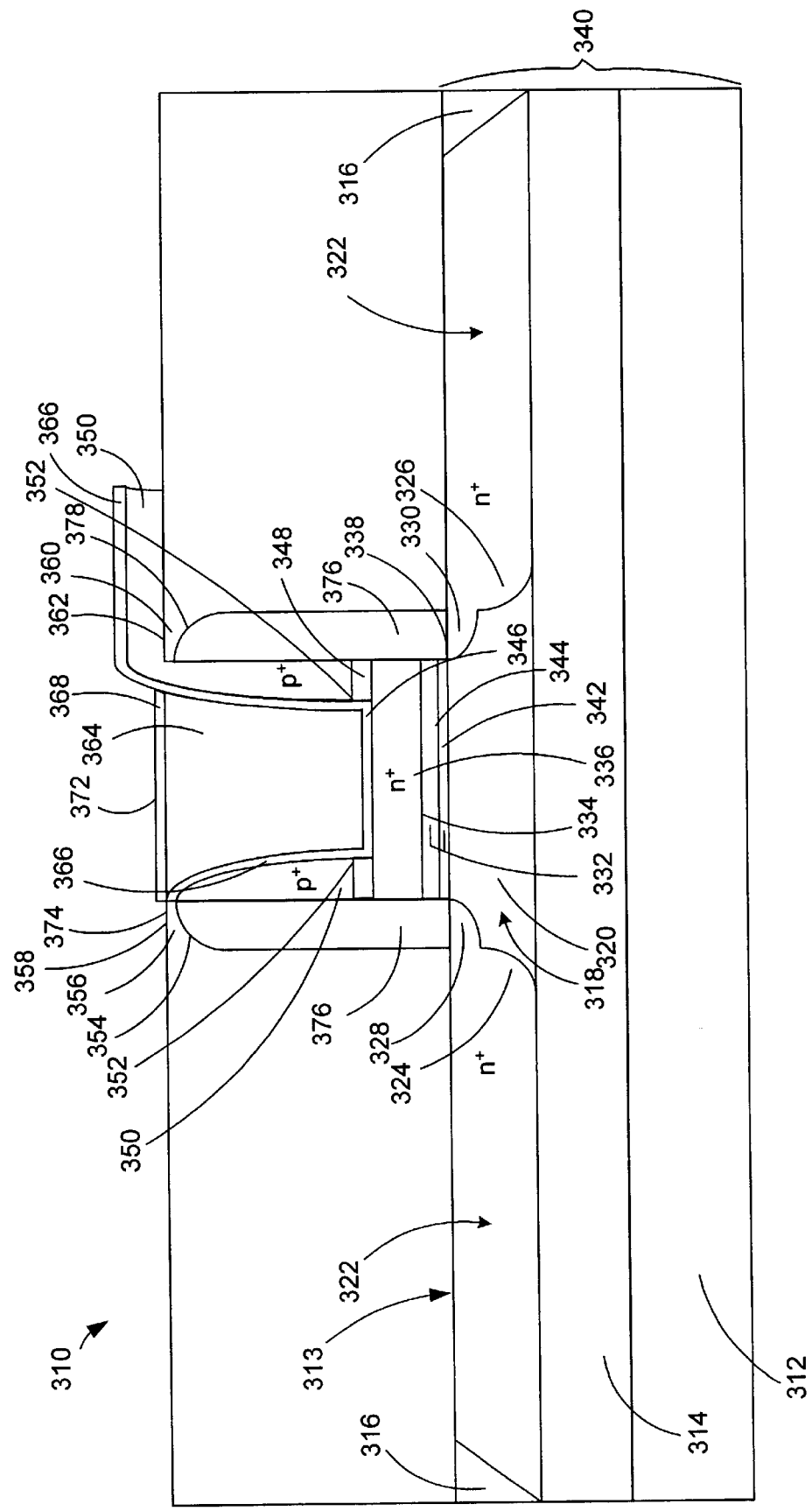
FIG. 3F is a cross-section of the SOI TJT SRAM cell device according to the present invention in a sixth intermediate stage of manufacture.

Next, in step 240, the undoped polysilicon 364 is nitridized. The nitridation can be done for example in NH3 at 900° C. for 2 to 3 minutes. The nitridation forms thin nitride layer 368 on the undoped polysilicon 364, as illustrated in FIG. 3F. Depositing nitride using conventional RTA techniques may also form the thin nitride layer 368. The resulting structure as illustrated in FIG. 3F remains.

Figure 3G:
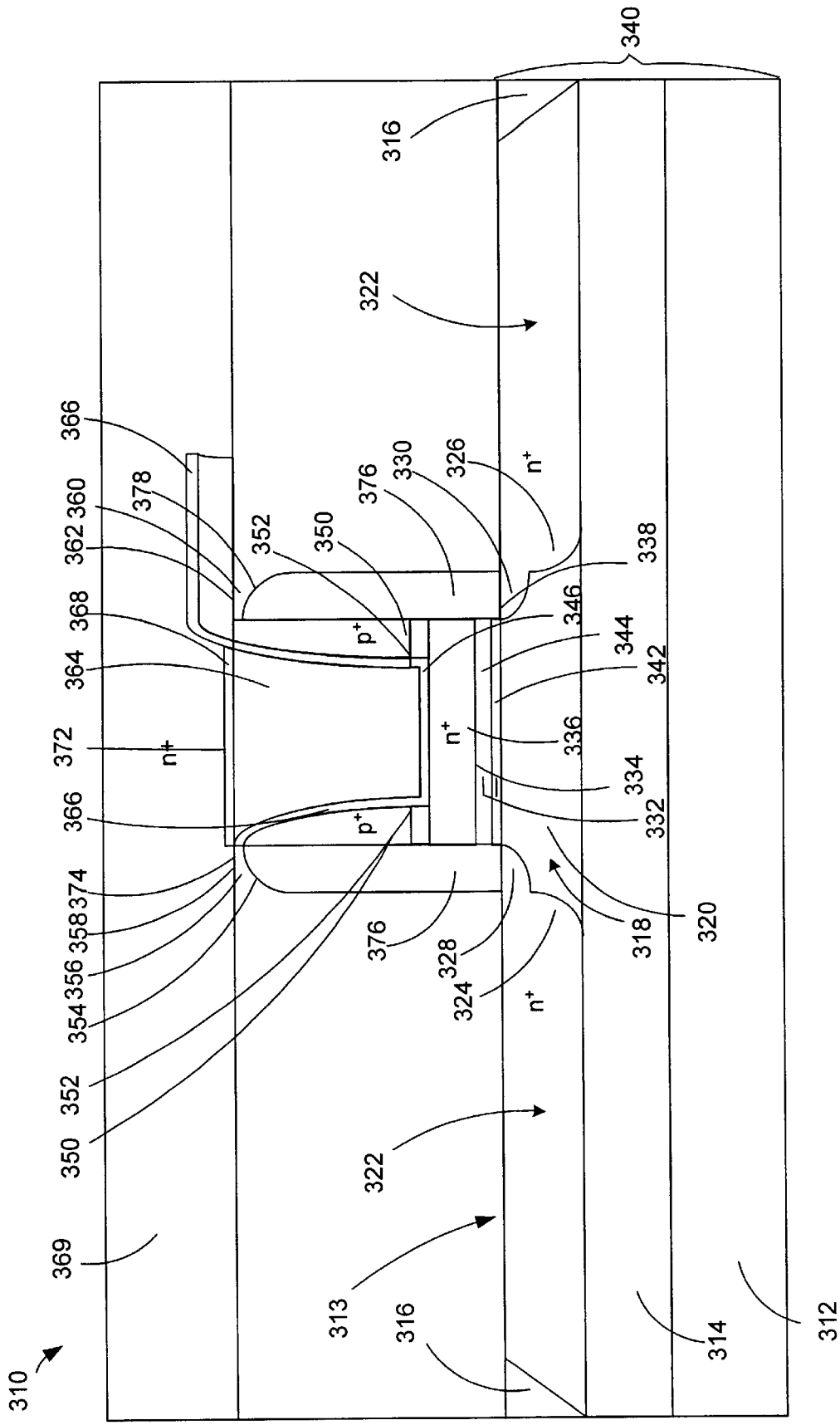
FIG. 3G is a cross-section of the SOI TJT SRAM cell device according to the present invention in a seventh intermediate stage of manufacture.

Next, in step 244, a polysilicon layer 369 is deposited over the entire intermediate device 310. The polysilicon may be N+ predoped or an implantation step may be done at this time to implant the polysilicon. The resulting structure is illustrated in FIG. 3G.

Next, in step 248, a mask is deposited and patterned over the region of the intermediate device 310 where a N+ polysilicon layer 370 is required as well as over the region where the word line will be formed out of the nitride layer 366 and the P+ polysilicon side gate electrode 350 covering the TEOS layer 362. Next, in step 252, a suitable dry etchant technique may thereafter be used to remove, as desired, unprotected portions of the polysilicon layer 369, covering the nitride layer 366 and the TEOS layer 362.

The etching performed in step 252 may be done in two steps. First an etch using $SF_6$ chemistry may be performed to remove the exposed N+ polysilicon layer 369. Thereafter an etch utilizing chlorine (Cl) chemistry may be done to smooth the walls of the N+ polysilicon layer 370, the nitride layer 366 and the P+ polysilicon side gate electrode 350 covering the TEOS layer 362.

Next, in step 256, and as illustrated in FIG. 1, a contact plug 80 is formed. The contact plug 80 is formed by masking the TEOS layer 58 to define the position of the contact plug 80 and etching a recess in the TEOS layer 58 down to at least a top surface of the SOI substrate 40 above the source 22 and, if desired, into the source 22. Next, the recess is filled with the material selected for the contact plug 80. It will further be appreciated that the contact plug 80 may be formed at an earlier step in the method, rather than being formed as the last step in manufacturing the SOI TJT SRAM cell device 10. For example, the contact plug 80 may be formed any time after the TEOS layer 58 has been formed on the SOI substrate 40. For example, after the TEOS layer 358 is deposited and polished back in step 216 to expose the nitride topped gate. Additional openings may be made in the TEOS layers 58, 62 to allow electrical connection to be made with the source and drain regions, and with the gate electrode. Conventional well-known methods may be utilized to make openings therethrough, as described above.

Figure 4:
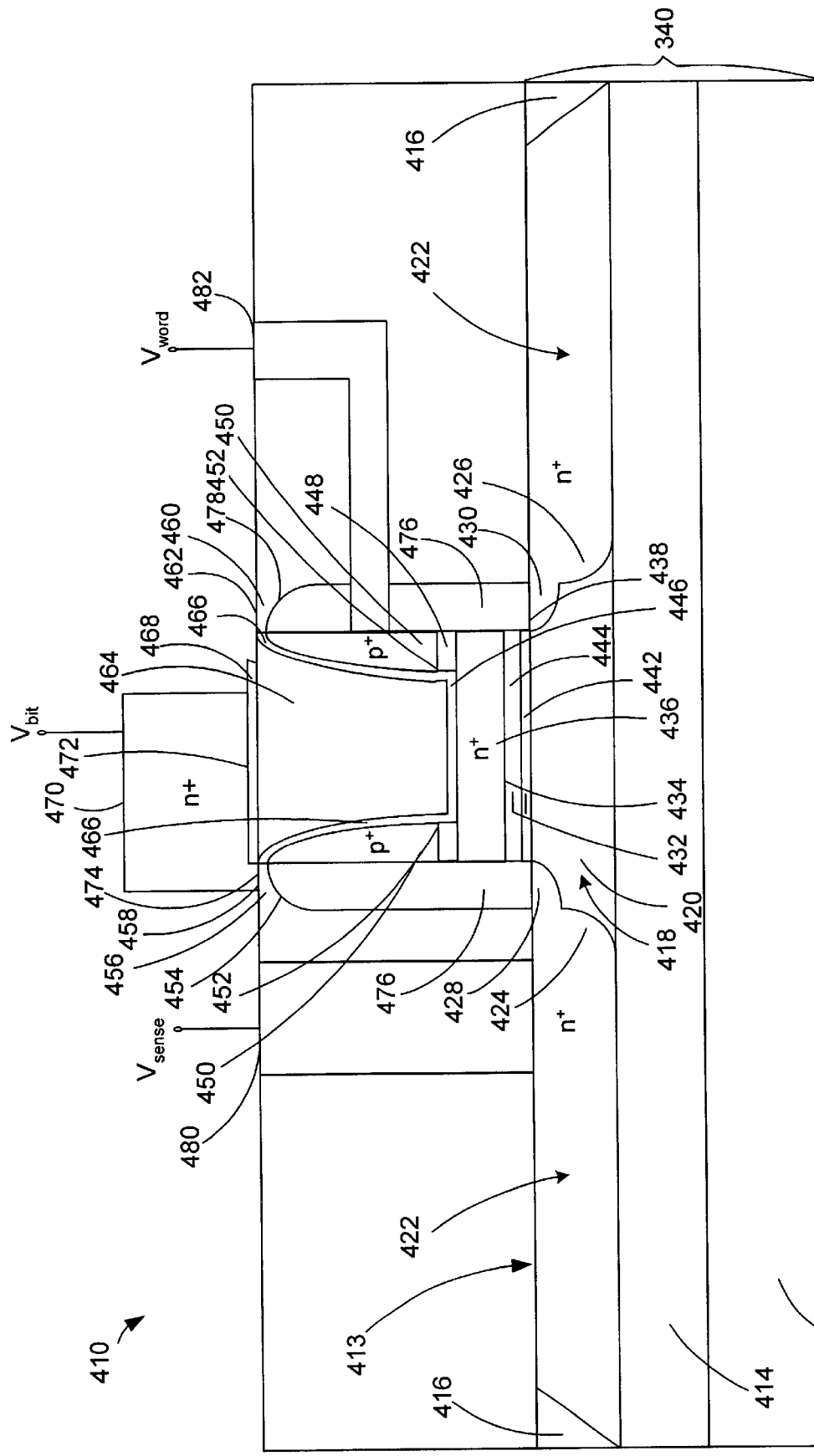
FIG. 4 is a cross-section of a second embodiment of an SOI TJT SRAM cell device according to the present invention.

Referring now to FIG. 4, a second embodiment of a SOI TJT SRAM cell device 410 is described. In this embodiment the P+ polysilicon side gate 450 does not extend over the TEOS layer 462 but extends only to the lower surface 478 of the overhang 460. The nitride layer 466 covers the P+ polysilicon side gate 450 and is substantially even with the upper surface of the TEOS layer 462 after it has been polished back during the polishing back of the undoped polysilicon 464. A conventional etching process forms a recess wherein a contact plug 482 may be formed to make electrical contact with the P+ polysilicon side gate 450. Next, the recess formed by the contact etch step is filled with a conductive layer such as tungsten or one of the other materials described above. This material forms the contact plug 482. In this embodiment, the contact plug 482 is fabricated after device definition but before any contact and/or metal layers are formed. The contact plug 482 can serves as an electrical contact for the P+ polysilicon side gate 450.

As one skilled in the art will appreciate, the formation of the contact plugs 480, 482 can be completed before definition of the SOI TJT SRAM cell device 410. An example of this process will be described below. When defining the contact plug 480 before the SOI TJT SRAM cell device 410 is defined, the contact plug 480 can be made from a semiconductor (such as polysilicon) rather than a metal or a metal alloy to make processing of the SOI TJT SRAM cell device 10 easier. It is noted that semiconductors may have lower thermal conduction properties than a metal. Nevertheless, the presence of a semiconductor contact plug 480 improves thermoconduction from the device to the substrate than would otherwise be accomplished through the BOX layer 14 alone. Subsequently, $V_{sense}$, $V_{bit}$ and $V_{word}$ connections are formed using conventional techniques in order to establish electrical connections between other nodes (such as an I/O pad or Vss), the source 422 or the drain 422 of the device as well as a power supply or a ground, if desired. The formation of the connections are completed in step 256 and shown in an exemplary formation in FIG. 1.

Although particular embodiments of the invention have been described in detail, it is understood that the invention is not limited correspondingly in scope, but includes all changes, modifications and equivalents coming within the spirit and terms of the claims appended hereto.

What is claimed is:

1. A tunneling junction transistor (TJT) static random access memory (SRAM) cell device formed on a semiconductor-on-insulator (SOI) substrate with a buried oxide (BOX) layer disposed thereon and an active layer disposed on the BOX layer having active regions defined by isolation trenches, the TJT device comprising:

a first gate defining a channel interposed between a source and a drain formed within one of the active regions of the SOI substrate;

a second gate including a plurality of thin nitride layers interposed between an undoped region and a first gate electrode, a side gate electrode, and a polysilicon layer;

a contact plug adjacent and in electrical contact with at least one of the source and the drain; and at least one of a plurality of electrical connections of the TJT SRAM cell device electrically coupled respectively to at least one node.

2. A TJT SRAM cell device according to claim 1, wherein the first gate and the second gate are stacked over one of the active regions.

3. A TJT SRAM cell device according to claim 1, wherein the plurality of thin nitride layers form tunneling junctions between the electrodes.

4. The TJT SRAM cell device according to claim 1, wherein the source and the drain are identically doped.

5. The TJT SRAM cell device according to claim 1, wherein the source and the drain are N+ doped.

6. The TJT SRAM cell device according to claim 1, wherein the side gate electrode is P+ doped.

7. The TJT SRAM cell device according to claim 1, wherein the first gate is formed before the source and the drain.

8. The TJT SRAM cell device according to claim 1, wherein the source and the drain are formed before the first gate.

9. The TJT SRAM cell device according to claim 1, wherein the contact plug is formed after the source and the drain.

10. The TJT SRAM cell device according to claim 1, wherein the side gate electrode is polysilicon.

11. The TJT SRAM cell device according to claim 1, wherein the contact plug is tungsten.

12. The TJT SRAM cell device according to claim 1, wherein the contact plug is a semiconductor material.

13. The TJT SRAM cell device according to claim 1, wherein the first dielectric layer is a silicon nitride.

14. The TJT SRAM cell device according to claim 1, wherein the second dielectric layer is a silicon nitride.

15. The TJT SRAM cell device according to claim 1, wherein the first gate includes a first gate electrode.

16. The TJT SRAM cell device according to claim 15, wherein the first gate electrode of the first gate is formed of a semiconductor material.

17. The TJT SRAM cell device according to claim 15, wherein the first gate electrode of the first gate is formed of a polysilicon.

18. The TJT SRAM cell device according to claim 15, wherein the first gate electrode of the first gate is N+ doped.

19. The TJT SRAM cell device according to claim 1, wherein the second gate includes a polysilicon layer.

20. The TJT SRAM cell device according to claim 19, wherein the polysilicon layer of the second gate is formed of a semiconductor material.

21. A tunneling junction transistor (TJT) SRAM cell device for a semiconductor-on-insulator (SOI) substrate with a buried oxide layer disposed thereon and an active layer disposed on the buried oxide layer having active regions defined by isolation trenches, the TJT SRAM cell device formed on the SOI substrate and comprising:
  at least two gates stacked vertically on the active region, wherein the first gate is stacked on top of the active region defining a channel interposed between a source and a drain within the active region;
  the second gate is stacked on top of the first gate, wherein the second gate includes a first dielectric layer between an undoped channel and the first gate and a second dielectric layer between the undoped channel and a side gate electrode; and
  a contact plug adjacent and in electrical contact with the source, the contact plug electrically couples the source to other nodes of the TJT SRAM cell device.

22. A tunneling junction transistor (TJT) SRAM cell device formed on a semiconductor-on-insulator (SOI) substrate with a buried oxide (BOX) layer disposed thereon and an active layer disposed on the BOX layer having active regions defined by isolation trenches, the TJT SRAM cell device comprising:
  a first gate defining a channel interposed between a source and a drain formed within one of the active regions of the SOI substrate;
  a second gate including a plurality of thin nitride layers interposed between an undoped region and a first gate electrode, a side gate electrode, and a polysilicon layer;
  a first contact plug adjacent and in electrical contact with at least one of the source and the drain;
  a second contact plug adjacent and in electrical contact with the side gate electrode of the second gate; and
  at least one of electrical connections of the TJT SRAM cell device electrically coupled respectively to at least one node.

* * * * *